(12) United States Patent
Kim et al.

(10) Patent No.: US 9,568,830 B2
(45) Date of Patent: Feb. 14, 2017

(54) THINNER COMPOSITION FOR IMPROVING COATING AND REMOVING PERFORMANCE OF RESIST

(71) Applicant: DONGWOO FINE-CHEM CO., LTD., Jeollabuk-do (KR)

(72) Inventors: Jeong Hwan Kim, Jeollabuk-do (KR); Kyong Ho Lee, Gyeonggi-do (KR); In Kak Song, Daejeon (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 0 days.

(21) Appl. No.: 14/736,018

(22) Filed: Jun. 10, 2015

(65) Prior Publication Data
US 2015/0355545 A1 Dec. 10, 2015

(30) Foreign Application Priority Data
Jun. 10, 2014 (KR) .................. 10-2014-0070219

(51) Int. Cl.
*G03F 7/40* (2006.01)
*G03F 7/42* (2006.01)
(Continued)

(52) U.S. Cl.
CPC ............. *G03F 7/422* (2013.01); *C11D 3/2068* (2013.01); *C11D 11/0047* (2013.01); *G03F 7/09* (2013.01);
(Continued)

(58) Field of Classification Search
CPC ...... G03F 7/168; G03F 7/422; C11D 11/0047; C11D 3/266; C11D 3/2068; H01L 21/02282
(Continued)

(56) References Cited

U.S. PATENT DOCUMENTS 6,589,719 B1 * 7/2003 Ahn .................. G03F 7/422
430/329
6,682,876 B2 * 1/2004 Ahn .................. G03F 7/168
430/327
(Continued)

FOREIGN PATENT DOCUMENTS

JP 06184595 A * 7/1994
JP 2001188360 A * 7/2001
(Continued)

OTHER PUBLICATIONS

Machine translation of JP 2001-188360 (no date).*
Machine translation of JP 06-184595 (no date).*

*Primary Examiner* — Amanda C Walke
(74) *Attorney, Agent, or Firm* — The PL Law Group, PLLC

(57) ABSTRACT

Provided are a thinner composition for improving coating property of a resist and for removing the same, which includes 10 to 80 wt. % of alkyl (with 1 to 5 carbon atoms) 2-hydroxyisobutyrate, 20 to 90 wt. % of propyleneglycol alkyl (with 1 to 5 carbon atoms)ether acetate, and 10 to 1000 ppm of a surfactant represented by Formula 1 to a total weight of the alkyl 2-hydroxyisobutyrate and propyleneglycol alkylether acetate, so as to achieve excellent solubility to various photoresists and bottom anti-reflective coatings (BARC) and high edge bead removing (EBR) performance, possibly be employed in a process for recycling photoresist-coated wafers, and remarkably improve coating property of the photoresist, and a method for manufacturing a semiconductor device or a thin film transistor liquid crystal display device including removal of the photoresist by using the above-described thinner composition.

18 Claims, 1 Drawing Sheet

(51) Int. Cl.
   *G03F 7/16*    (2006.01)
   *H01L 21/02*   (2006.01)
   *C11D 11/00*   (2006.01)
   *C11D 3/20*    (2006.01)
   *G03F 7/09*    (2006.01)

(52) U.S. Cl.
   CPC ................ *G03F 7/16* (2013.01); *G03F 7/168* (2013.01); *H01L 21/02282* (2013.01)

(58) Field of Classification Search
   USPC .................... 430/331; 510/175, 176; 134/1.3
   See application file for complete search history.

(56) References Cited

U.S. PATENT DOCUMENTS

| | | | | |
|---|---|---|---|---|
| 6,777,039 | B2* | 8/2004 | Koike | B41M 5/52 427/385.5 |
| 7,063,930 | B2* | 6/2006 | Chai | C11D 1/83 430/256 |
| 7,875,420 | B2* | 1/2011 | Inatomi | G03F 7/40 430/270.1 |
| 8,614,053 | B2* | 12/2013 | Quillen | G03F 7/426 430/311 |
| 2003/0113673 | A1* | 6/2003 | Ahn | G03F 7/168 430/331 |
| 2003/0227005 | A1* | 12/2003 | Peterson | C11D 11/0047 252/364 |
| 2005/0176607 | A1* | 8/2005 | Ahn | C11D 11/0047 510/176 |
| 2008/0214422 | A1* | 9/2008 | Ahn | C11D 11/0047 510/176 |
| 2009/0195761 | A1* | 8/2009 | De Graaf | G03F 7/70341 355/30 |
| 2010/0242998 | A1* | 9/2010 | Quillen | C11D 7/34 134/19 |
| 2012/0108486 | A1* | 5/2012 | Quillen | C11D 7/34 510/176 |
| 2012/0219755 | A1* | 8/2012 | Bae | G03F 7/325 428/141 |
| 2013/0078580 | A1* | 3/2013 | Yun | G03F 7/168 430/449 |
| 2013/0171825 | A1* | 7/2013 | Xu | H01L 21/0274 438/694 |
| 2014/0186772 | A1* | 7/2014 | Pohlers | G03F 7/405 430/311 |

FOREIGN PATENT DOCUMENTS

| | | |
|---|---|---|
| KR | 10-2011-0021189 A | 3/2011 |
| KR | 10-2013-0130437 A | 12/2013 |

\* cited by examiner

THINNER COMPOSITION FOR IMPROVING COATING AND REMOVING PERFORMANCE OF RESIST

BACKGROUND

1. Field of the Invention

The present invention relates to a thinner composition for improving coating property of a resist and for removing the same, and a method for manufacturing a semiconductor device or a thin film transistor liquid crystal display device by using the same.

2. Description of the Related Art

In a process for manufacturing a semiconductor device, a working process including applying a photo-sensitive resin composition to a wafer, transferring a designed pattern thereto and forming a micro-fine circuit pattern such as a semiconductor integrated circuit through etching refers to photolithography. The photolithography includes achieving a desired micro-fine circuit pattern through a series of processes including applying, exposing, developing, etching and stripping.

In this regard, the exposing process is executed by minutely exposing the desired pattern on a coating film using a light in UV ray range as a short wavelength, therefore, becomes sensitive to a contamination source. Accordingly, a residue of photoresist applied to a substrate during applying, or contaminants may become a contamination source during exposing process. Therefore, these materials should be removed in advance. Herein, a thinner composition (for removing edge beads) has been used in the above process.

Meanwhile, since the photoresist using KrF and ArF (including ArF immersion) light source with a short wavelength has recently been employed, the extent of using the photoresist increasingly influences upon production costs of the integrated circuit. Accordingly, there has been a requirement for reducing the extent of using photoresist to save expenses. For this purpose, a reducing resist consumption (RRC) process that treats the surface of a substrate with a treatment composition before application of the photoresist to thus uniformly spread the photoresist throughout the surface of the substrate even with a small amount of photoresist, has been employed.

Japanese Patent Laid-Open Publication No. 2001-188359 discloses an edge bead remover including propyleneglycol ether acetate and methyl α-hydroxyisobutyrate. However, this product cannot be used to the RRC process, although it may be used in EBR process and have excellent rework performance.

In addition, Japanese Patent Laid-Open Publication No. 2005-227770 discloses a thinner composition including propyleneglycol ether acetate and methyl 2-hydroxy-2-methyl propionate as well as ethyl lactate or ethyl 3-ethoxy propionate, as principal components, and further including a fluorine-based, non-ionic or ionic surfactant. However, if the surfactant is not contained, it is difficult to use the above composition in the RRC process. On the other hand, when the surfactant is included, the above composition may be employed in the RRC process, however, entail a problem of low rework performance since the surfactant remains on the surface of a wafer.

Accordingly, there is still a requirement for development of a treatment agent composition with high RRC efficiency while being sufficiently and reliably employed in the existing EBR process.

SUMMARY

Accordingly, it is an object of the present invention to provide a thinner composition that is simultaneously applicable to both of an EBR process and a RRC process.

Another object of the present invention is to provide a method for treatment of a substrate by using the above-described thinner composition.

The above objects of the present invention will be achieved by the following characteristics:

(1) A thinner composition for improving coating property of a resist and for removing the same, including: 10 to 80 percent by weight of alkyl (with 1 to 5 carbon atoms) 2-hydroxyisobutyrate; 20 to 90 percent by weight of propyleneglycol alkyl (with 1 to 5 carbon atoms)ether acetate; and a surfactant represented by Formula 1 below in an amount of 10 to 1,000 ppm to a total weight of the alkyl 2-hydroxyisobutyrate and propyleneglycol alkylether acetate:

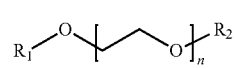

[Formula 1]

(wherein $R_1$ and $R_2$ are each independently hydrogen, alkyl group having 1 to 10 carbon atoms or aryl group having 6 to 14 carbon atoms, and n is an integer of 1 to 5).

(2) The thinner composition according to the above (1), wherein the alkyl 2-hydroxyisobutyrate is at least one selected from a group consisting of methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate and tert-butyl 2-hydroxyisobutyrate.

(3) The thinner composition according to the above (1), wherein the propyleneglycol alkylether acetate is at least one selected from a group consisting of propyleneglycol methylether acetate, propyleneglycol ethylether acetate, propyleneglycol propylether acetate, propyleneglycol isopropylethe acetate and propyleneglycol butylether acetate.

(4) The thinner composition according to the above (1), wherein the surfactant is at least one selected a group consisting of ethyleneglycol methylether, ethyleneglycol dimethylether, ethyleneglycol ethylether, ethyleneglycol methylethylether, ethyleneglycl diethylether, diethyleneglycol methylether, diethyleneglycol dimethylether, diethyleneglycol ethylether, diethyleneglycol methylethylether, diethyleneglycol diethylether, diethyleneglycol propylether, diethyleneglycol methylpropylether, diethyleneglycol ethylpropylether and diethyleneglycol dipropylether.

(5) The thinner composition according to the above (1), including: 20 to 60 percent by weight of the alkyl 2-hydroxyisobutyrate; 40 to 80 percent by weight of the propyleneglycol alkylether acetate; and 10 to 500 ppm of the surfactant to a total weight of the alkyl 2-hydroxyisobutyrate and propyleneglycol alkylether acetate.

(5) The thinner composition according to the above (1), including: 20 to 50 percent by weight of the alkyl 2-hydroxyisobutyrate; 50 to 80 percent by weight of the propyleneglycol alkylether acetate; and 10 to 500 ppm of the surfactant to a total weight of the alkyl 2-hydroxyisobutyrate and propyleneglycol alkylether acetate.

(7) A method for treatment of a substrate including: using the thinner composition according to any one of the above (1) to (6), before application of a photoresist to the substrate.

(8) A method for treatment of a substrate including: using the thinner composition according to any one of the above (1) to (6), after application of a photoresist to the substrate and before an exposing process.

The thinner composition for improving coating property of a resist and for removing the same according to the present invention may have excellent solubility to ArF photoresist and other various photoresists and bottom anti-reflective coatings (BARC), thereby exhibiting remarkably improved EBR characteristics.

The thinner composition for improving coating property of a resist and for removing the same according to the present invention may also be employed in a process for recycling a wafer coated with photoresist.

In addition, the thinner composition for improving coating property of a resist and for removing the same according to the present invention may enable a photoresist to be uniformly applied to an overall face of the substrate even using a small amount of the photoresist to improve coating performance, thereby exhibiting excellent effects in the RRC process executed to minimize the extent of using the photoresist.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
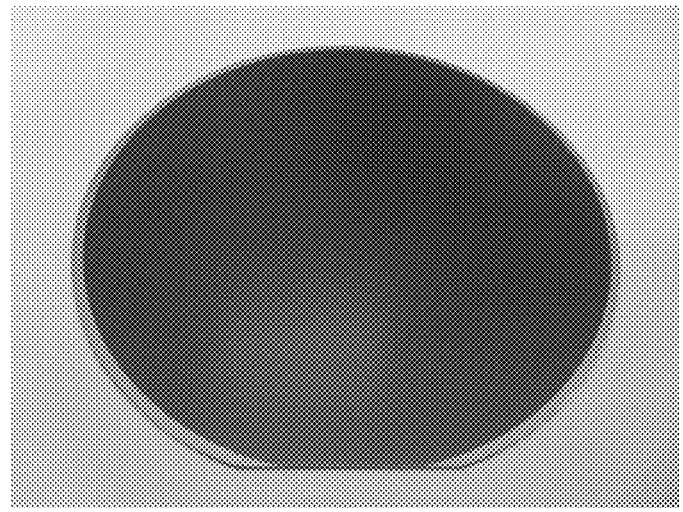
FIG. 1 is a photograph illustrating a case in which 0.5 cc of a thinner composition of Example 1 is applied to an 8-inch wafer, and then, a photoresist is applied thereto, thus allowing 98% or more of the photoresist to be applied to the wafer.

The present invention provides a thinner composition for improving coating property of a resist and for removing the same, which includes 10 to 80 percent by weight ('wt. %') of alkyl (with 1 to 5 carbon atoms) 2-hydroxyisobutyrate, 20 to 90 wt. % of propyleneglycol alkyl (with 1 to 5 carbon atoms)ether acetate, and 10 to 1000 ppm of a surfactant represented by Formula 1 to a total weight of the alkyl 2-hydroxyisobutyrate and propyleneglycol alkylether acetate, so as to achieve excellent solubility to various photoresists and bottom anti-reflective coatings (BARCs), and high edge bead removing (EBR) performance, possibly be employed in a process for recycling photoresist-coated wafers, and remarkably improve coating property of the photoresist, and a method for manufacturing a semiconductor device or a thin film transistor liquid crystal display device including removal of the photoresist by using the above-described thinner composition.

Hereinafter, the present invention will be described in detail.

<Thinner Composition>

The thinner composition for improving coating property of a resist and for removing the same according to the present invention includes alkyl (with 1 to 5 carbon atoms) 2-hydroxyisobutyrate in an amount of 10 to 80 wt. %, and preferably, 20 to 60 wt. %, and more preferably from 20 to 50 wt. % to a total weight of the composition, so as to secure excellent solubility to photoresist. Specifically, if a content thereof is less than 10 wt. %, the solubility to photoresist is decreased to reduce EBR characteristics. On the other hand, when the content thereof exceeds 80 wt. %, effects of improving the solubility to photoresist are not sufficient while increasing a viscosity of the composition, thus causing a problem in the RRC process.

The alkyl 2-hydroxyisobutyrate according to the present invention may be, for example, any one known in the related art without particular limitation thereof. Preferably, methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate, tert-butyl 2-hydroxyisobutyrate, or the like, may be exemplified. These may be used along or in combination of two or more thereof.

Further, the thinner composition for improving coating property of a resist and for removing the same may include propyleneglycol alkyl (with 1 to 5 carbon atoms)ether acetate in an amount of 20 to 90 wt. %, and preferably, 40 to 80 wt. %, and more preferably, 50 to 80 wt. % to a total weight of the composition, so as to achieve a desired volatile rate and exhibit excellent EBR and RRC characteristics. Specifically, if the content of the compound is less than 20 wt. %, the volatile rate of the composition is decreased to lead to a poor EBR profile. When the content thereof exceeds 90 wt. %, the volatile rate of the composition becomes higher, hence causing a deterioration in RRC characteristics.

Propyleneglycol alkylether acetate according to the present invention may be any one known in the related art without particularly limitation thereof. Preferably, propyelenglycol methylether acetate, propyleneglycol ethylether acetate, propyleneglycol propylether acetate, propyleneglycol isopropylether acetate, propyleneglycol butylether acetate, or the like, may be exemplified. These compounds may be used alone or in combination of two or more thereof.

Further, the thinner composition for improving coating property of a resist and for removing the same according to the present invention may include a surfactant represented by Formula 1 in an amount of 10 to 1000 ppm, and preferably, 10 to 500 ppm to a total weight of the alkyl 2-hydroxyisobutyrate and propyleneglycol alkylether acetate.

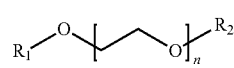

[Formula 1]

(wherein $R_1$ and $R_2$ are each independently hydrogen, alkyl group having 1 to 10 carbon atoms or aryl group having 6 to 14 carbon atoms, and n is an integer of 1 to 5).

Since the inventive composition involves the surfactant, it is possible to uniformly spread a photoresist throughout a substrate due to a reduced surface tension, thereby being possibly employed in a RRC process. In addition, compared to a case of using fluorine-based, nonionic or ionic surfactants typically included in conventional thinner compositions, it may prevent a problem of surfactant residue remaining on the surface of the substrate, enhance rework performance, and accomplish other effects such as prevention of problems occurred in the subsequent processes.

If a content of the surfactant is less than 10 ppm, surface tension reducing effects of the thinner composition are not sufficient to hence fail in uniform coating of the photoresist during photoresist coating. Further, it cannot overcome a difference in micro-fine pattern height on the wafer to hence cause a splitting phenomenon of edges. On the other hand, when the content of the surfactant exceeds 1000 ppm, there is a potential problem that the surfactant remains residue on the wafer.

The surfactant according to the present invention may be any conventional surfactant known in the related art without particular limitation thereof. Preferably, ethyleneglycol methylether, ethyleneglycol dimethylether, ethyleneglycol ethylether, ethyleneglycol methylethylether, ethyleneglycl diethylether, diethyleneglycol methylether, diethyleneglycol dimethylether, diethyleneglycol ethylether, diethyleneglycol methylethylether, diethyleneglycol diethylether, diethyleneglycol propylether, diethyleneglycol methylpropylether, diethyleneglycol ethylpropylether and diethyleneglycol dipropylether, or the like, may be exemplified. These compounds may be used alone or in combination of two or more thereof.

The thinner composition of the present invention described above has excellent solubility to a variety of photoresist films and BARCs, can improve EBR characteristics, reworking property and coating performance of the photoresist, and exhibits excellent RRC characteristics. In particular, in the case of the photoresist for i-line, KrF, ArF and EUV, constitutional photoresists have different basic structures, therefore, controlling a fractional content of an organic solvent used for improving the solubility and coating property of all of these constitutional photoresists is required. In this regard, the present thinner composition may satisfy the above requirements.

<Treatment of Substrate>

The present invention may provide a method for treatment of a substrate manufactured using the thinner composition according to the present invention.

The method for treatment of a substrate according to the present invention includes treating the substrate with the thinner composition described above, and then applying a photoresist thereto.

As the photoresist is applied to the substrate after treating the substrate with the above-described thinner composition, the substrate can be coated with even a small amount of photoresist so as to enhance process costs and productivity.

The treatment of a substrate according to the present invention may further include applying a photoresist to the substrate after treating the substrate with the above-described thinner composition, and then, treating the substrate again with the thinner composition before an exposing process.

By treating the substrate again with the thinner composition in the above step, it is possible to rapidly and effectively remove the undesired photoresist applied to edges or the rear face of the substrate before the exposing process.

The method for treatment of a substrate according to the present invention may be employed in any process for manufacturing products provided with photoresists, for example, electronic devices without particular limitation thereof. For instance, the present method may be applied to a process for manufacturing a semiconductor device or a thin film transistor liquid crystal display device.

Hereinafter, preferred embodiments will be given for more concretely understanding the present invention, however, the following examples are proposed only for illustrating the present invention but not restricting the appended claims. Therefore, it will be obviously understood by those skilled in the related art that various alterations and modifications of these examples are possible within the scope and technical spirits of the present invention, and such alterations and modifications are duly included in the range of the appended claims.

Examples and Comparative Examples

Individual components with predetermined fractional ratios listed in Table 1 were added to a mixing tank equipped with a stirrer, followed by agitating the mixture with a speed of 500 rpm at room temperature for 1 hour, thus preparing a thinner composition.

TABLE 1

| Item | Alkyl 2-hydroxyisobutyrate (A) | | Propyleneglycol alkylether acetate (B) | | EL | EEP | Surfactant represented by Formula 1 (C) | | Fluorine or silicon surfactant (D) | |
|---|---|---|---|---|---|---|---|---|---|---|
| | Type | Wt. % | Type | Wt. % | type % | Wt. % | Type | ppm | Type | ppm |
| Example 1 | A-1 | 20 | B-1 | 80 | — | — | C-1 | 10 | — | — |
| Example 2 | A-1 | 40 | B-1 | 60 | — | — | C-1 | 100 | — | — |
| Example 3 | A-1 | 60 | B-1 | 40 | — | — | C-1 | 500 | — | — |
| Example 4 | A-1 | 15 | B-1 | 85 | — | — | C-1 | 550 | — | — |
| Example 5 | A-2 | 20 | B-2 | 80 | — | — | C-2 | 10 | — | — |
| Example 6 | A-3 | 20 | B-1 | 80 | — | — | C-3 | 10 | — | — |
| Example 7 | A-2 | 20 | B-3 | 80 | — | — | C-1 | 10 | — | — |
| Comparative Example 1 | A-1 | 100 | — | — | — | — | C-1 | 100 | — | — |
| Comparative Example 2 | — | — | B-1 | 100 | — | — | C-1 | 100 | — | — |
| Comparative Example 3 | A-1 | 50 | B-1 | 50 | — | — | — | — | — | — |
| Comparative Example 4 | A-1 | 40 | B-1 | 60 | — | — | — | — | D-1 | 100 |
| Comparative Example 5 | A-1 | 40 | B-1 | 60 | — | — | — | — | D-2 | 100 |
| Comparative Example 6 | A-1 | 50 | — | — | 50 | — | — | — | — | — |
| Comparative Example 7 | A-1 | 50 | — | — | — | 50 | — | — | — | — |
| Comparative Example 8 | — | — | B-1 | 50 | 50 | — | — | — | — | — |

TABLE 1-continued

| Item | Alkyl 2-hydroxyisobutyrate (A) Type | Wt. % | Propyleneglycol alkylether acetate (B) Type | Wt. % | EL type % | EEP Wt. % | Surfactant represented by Formula 1 (C) Type | ppm | Fluorine or silicon surfactant (D) Type | ppm |
|---|---|---|---|---|---|---|---|---|---|---|
| Comparative Example 9 | — | — | B-1 | 50 | — | 50 | — | — | — | — |
| Comparative Example 10 | A-1 | 40 | B-1 | 50 | 10 | — | — | — | — | — |
| Comparative Example 11 | A-1 | 40 | B-1 | 45 | — | 15 | — | — | — | — |
| Comparative Example 12 | A-1 | 40 | B-1 | 50 | 10 | — | — | — | D-1 | 100 |
| Comparative Example 13 | A-1 | 40 | B-1 | 45 | — | 15 | — | — | D-2 | 100 |
| Comparative Example 14 | A-1 | 5 | B-1 | 95 | — | — | C-1 | 5 | — | — |
| Comparative Example 15 | A-1 | 85 | B-1 | 15 | — | — | C-1 | 5 | — | — |
| Comparative Example 16 | A-4 | 20 | B-1 | 80 | — | — | C-1 | 10 | — | — |

A-1: Methyl 2-hydroxyisubutyrate
A-2: Ethyl 2-hydroxyisobutyrate
A-3: Propyl 2-hydroxyisobutyrate
A-4: Methyl 2-hydroxypropylate
B-1: Propyleneglycol methylether acetate
B-2: Propyleneglycol propylether acetate
B-3: Propyleneglycol ethylether acetate
C-1: Doethyleneglycol methylethylether
C-2: Diethyleneglycol dimethylether
C-3: Diethyleneglycol diethylether
D-1: Fluorinated acrylic copolymer
D-2: Polydimethylsiloxane Experimental Example 1

Assessment of EBR (Edge Bid Removing) Performance by Thinner Composition

After applying each photoresist listed in Table 2 to an 8-inch silicon oxide substrate, each of the compositions in the examples and comparative examples was subjected to EBR experiment to remove the undesired photosensitive film on edges under the conditions stated in Table 3. Each of the thinner compositions in the examples and comparative examples was provided from a compression barrel equipped with a pressure gauge, wherein a pressure was 1 kgf and a flow rate of the thinner composition discharged from EBR nozzle ranged from 10 to 30 cc/min. Then, performance of removing the undesired photosensitive film was determined using an optical microscope and results thereof are shown in Table 4 below.

<Standard for Assessment>
⊚: Constant EBR line uniformity in photosensitive film after EBR treatment
○: Favorable straight line condition with EBR line uniformity of 75% or more in photosensitive film after EBR treatment
Δ: Distorted shape condition of edge due to dissolution by thinner after EBR treatment
X: occurrence of tailing state in film at edge after EBR treatment

TABLE 2

| Item | Type of composition | Resin series | Film thickness (μm) |
|---|---|---|---|
| PR 1 | i-line PR | Novolac | 1.10 |
| PR 2 | KrF PR | Acetal (PHS) | 1.00 |
| PR 3 | ArF PR | Acrylate | 0.18 |
| BARC-1 | KrF BARC | — | 0.06 |
| BARC-2 | ArF BARC | — | 0.04 |

TABLE 3

| Item | Rotation speed (rpm) | Time (sec) |
|---|---|---|
| Dispense conditions | 300-2000 | 7 |
| Spin coating | Control along thickness of photosensitive film | — |
| EBR condition 1 | 2000 | 20 |
| EBR condition 2 | 2000 | 25 |
| EBR condition 3 | 1300 | 6 |

TABLE 4

| Item | PR1 | PR2 | PR3 | BARC-1 | BARC-2 |
|---|---|---|---|---|---|
| Example 1 | ⊚ | ⊚ | ⊚ | ⊚ | ⊚ |
| Example 2 | ⊚ | ⊚ | ⊚ | ⊚ | ⊚ |
| Example 3 | ⊚ | ⊚ | ⊚ | ⊚ | ⊚ |
| Example 4 | ○ | ○ | ⊚ | ⊚ | ⊚ |
| Example 5 | ⊚ | ⊚ | ⊚ | ⊚ | ⊚ |
| Example 6 | ⊚ | ⊚ | ⊚ | ⊚ | ⊚ |
| Example 7 | ⊚ | ⊚ | ⊚ | ⊚ | ⊚ |
| Comparative Example 1 | Δ | Δ | Δ | Δ | Δ |
| Comparative Example 2 | Δ | Δ | X | X | X |

TABLE 4-continued

| Item | PR1 | PR2 | PR3 | BARC-1 | BARC-2 |
|---|---|---|---|---|---|
| Comparative Example 3 | ◎ | ◎ | ◎ | ◎ | ◎ |
| Comparative Example 4 | ◎ | ◎ | ◎ | ◎ | ◎ |
| Comparative Example 5 | ◎ | ◎ | ◎ | ◎ | ◎ |
| Comparative Example 6 | Δ | Δ | Δ | Δ | Δ |
| Comparative Example 7 | Δ | Δ | Δ | Δ | Δ |
| Comparative Example 8 | ○ | ○ | ○ | ○ | ○ |
| Comparative Example 9 | ○ | ○ | ○ | ○ | ○ |
| Comparative Example 10 | ○ | ○ | ○ | ○ | ○ |
| Comparative Example 11 | ○ | ○ | ○ | ○ | ○ |
| Comparative Example 12 | ○ | ○ | ○ | ○ | ○ |
| Comparative Example 13 | ○ | ○ | ○ | ○ | ○ |
| Comparative Example 14 | Δ | Δ | Δ | Δ | Δ |
| Comparative Example 15 | Δ | Δ | Δ | Δ | Δ |
| Comparative Example 16 | Δ | Δ | Δ | Δ | Δ |

As shown in Table 4, it can be seen that the thinner composition of the present invention exhibits excellent EBR characteristics.

Specifically, it is understood that EBR characteristics are deteriorated if the propyleneglycol ether acetate or methyl 2-hydroxy-2-methyl propionate is not included within a predetermined content range. Meanwhile, in the case in which the surfactant according to the present invention is not included (Comparative Examples 3 to 5), RRC performance, coating uniformity and/or rework performance described below are considerably reduced, compared to the present invention although EBR characteristics are similar to those in the examples.

Experimental Example 2

Assessment of RRC (Reducing Resist Consumption) Performance Depending of Type of Photoresist Using each of the thinner compositions in the examples and comparative examples, RRC performance test was executed for 5 types of photoresists and BARCs, respectively. According to recipes stated in Table 5, after applying 0.5 cc of thinner to an 8-inch silicon oxide substrate, PR1: 1.2 cc, PR2: 1.0 cc, PR3: 0.8 cc, BARC-1: 0.5 cc, BARC-2: 0.4 cc were applied, respectively. Thereafter, a condition of the applied photoresist on the wafer was assessed and results thereof are shown in Table 6.

<Standard for Assessment>

◎: 98% or more of photoresist applied to the wafer

○: 96% or more of photoresist applied to the wafer

Δ: 94% or more of photoresist applied to the wafer

X: less than 94% of photoresist applied to the wafer

TABLE 5

| Step | Time (sec) | Speed (rpm) | Acceleration (rpm/sec) | Dispense (cc) |
|---|---|---|---|---|
| 1 | 2.5 | 0 | 10000 | 0.5 (thinner) |
| 2 | 1.5 | 900 | 10000 | 0 |
| 3 | 9.5 | 2000 | 10000 | 0 |
| 4 | 3.0 | 600 | 10000 | 0.4-1.2 (PR) |
| 5 | 5.0 | 1500 | 10000 | 0 |
| 6 | 10.0 | 1000 | 10000 | 0 |

TABLE 6

| Item | PR1 | PR2 | PR3 | BARC-1 | BARC-2 |
|---|---|---|---|---|---|
| Example 1 | ◎ | ◎ | ◎ | ◎ | ◎ |
| Example 2 | ◎ | ◎ | ◎ | ◎ | ◎ |
| Example 3 | ◎ | ◎ | ◎ | ◎ | ◎ |
| Example 4 | ○ | ◎ | ◎ | ◎ | ◎ |
| Example 5 | ◎ | ◎ | ◎ | ◎ | ◎ |
| Example 6 | ◎ | ◎ | ◎ | ◎ | ◎ |
| Example 7 | ◎ | ◎ | ◎ | ◎ | ◎ |
| Comparative Example 1 | Δ | Δ | Δ | Δ | Δ |
| Comparative Example 2 | X | X | X | X | X |
| Comparative Example 3 | Δ | Δ | Δ | Δ | Δ |
| Comparative Example 4 | Δ | Δ | Δ | Δ | Δ |
| Comparative Example 5 | Δ | Δ | Δ | Δ | Δ |
| Comparative Example 6 | X | X | X | X | X |
| Comparative Example 7 | X | X | X | X | X |
| Comparative Example 8 | Δ | Δ | Δ | Δ | Δ |
| Comparative Example 9 | Δ | Δ | Δ | Δ | Δ |
| Comparative Example 10 | Δ | Δ | Δ | Δ | Δ |
| Comparative Example 11 | Δ | Δ | Δ | Δ | Δ |
| Comparative Example 12 | Δ | Δ | Δ | Δ | Δ |
| Comparative Example 13 | Δ | Δ | Δ | Δ | Δ |
| Comparative Example 14 | Δ | Δ | Δ | Δ | Δ |
| Comparative Example 15 | Δ | Δ | Δ | Δ | Δ |
| Comparative Example 16 | Δ | Δ | Δ | Δ | Δ |

As shown in Table 6, it can be seen that the thinner composition according to the present invention exhibits excellent RRC characteristics, compared to the comparative examples.

Figure 2:
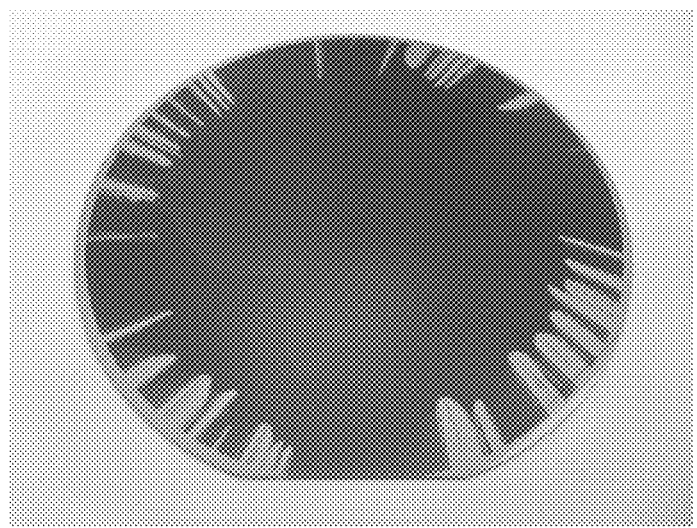
FIG. 2 is a photograph illustrating a case in which 0.5 cc of a thinner composition of Comparative Example 7 is applied to an 8-inch wafer, and then, a photoresist is applied thereto, thus allowing less than 94% of the photoresist to be applied to the wafer.

For reference, photographs illustrating the results of the RRC performance assessment using the thinner compositions in Example 1 and Comparative Example 7 are illustrated in FIG. 1 (Example 1) and FIG. 2 (Comparative Example 7), respectively.

Experimental Example 3

Evaluation of Coating Uniformity Depending of Type of Photoresist

Using the thinner compositions in the examples and comparative examples, a coating uniformity test was executed for five types of photoresists and BARCs listed in Table 2. According to recipes stated in Table 7, after applying the photoresist to an 8-inch silicon oxide substrate, film thicknesses of the photoresist on total 13 points including 1 point at the center of a wafer and each 3 points at upper, lower, left and right sides from the center of the wafer, respectively, were measured and a standard deviation was calculated from the measured values. From the calculated standard deviation, coating uniformity of the photoresist was evaluated and results thereof are shown in Table 8 below.

<Standard for Evaluation>

⊚: Standard deviation of applied film thickness equal to 1% or less of average film thickness ○: Standard deviation of applied film thickness equal to 2% or less of average film thickness Δ: Standard deviation of applied film thickness equal to 3% or less of average film thickness X: Standard deviation of applied film thickness exceeding 3% of average film thickness

TABLE 7

| Step | Time (sec) | Speed (rpm) | Acceleration (rpm/sec) | Dispense(cc) |
|---|---|---|---|---|
| 1 | 2.5 | 0 | 10000 | 0.5 (thinner) |
| 2 | 1.5 | 900 | 10000 | 0 |
| 3 | 9.5 | 2000 | 10000 | 0 |
| 4 | 3.0 | 600 | 10000 | 0.4-1.2 (PR) |
| 5 | 5.0 | 1500 | 10000 | 0 |
| 6 | 10.0 | 1000 | 10000 | 0 |

TABLE 8

| Item | PR1 | PR2 | PR3 | BARC-1 | BARC-2 |
|---|---|---|---|---|---|
| Example 1 | ⊚ | ⊚ | ⊚ | ⊚ | ⊚ |
| Example 2 | ⊚ | ⊚ | ⊚ | ⊚ | ⊚ |
| Example 3 | ⊚ | ⊚ | ⊚ | ⊚ | ⊚ |
| Example 4 | ○ | ⊚ | ⊚ | ⊚ | ⊚ |
| Example 5 | ⊚ | ⊚ | ⊚ | ⊚ | ⊚ |
| Example 6 | ⊚ | ⊚ | ⊚ | ⊚ | ⊚ |
| Example 7 | ⊚ | ⊚ | ⊚ | ⊚ | ⊚ |
| Comparative Example 1 | X | X | Δ | X | Δ |
| Comparative Example 2 | Δ | Δ | X | X | X |
| Comparative Example 3 | Δ | Δ | Δ | Δ | Δ |
| Comparative Example 4 | ○ | ○ | ○ | Δ | Δ |
| Comparative Example 5 | ○ | ○ | ○ | Δ | Δ |
| Comparative Example 6 | X | X | Δ | X | Δ |
| Comparative Example 7 | X | X | Δ | X | Δ |
| Comparative Example 8 | X | Δ | Δ | Δ | Δ |
| Comparative Example 9 | X | Δ | Δ | Δ | Δ |
| Comparative Example 10 | Δ | Δ | Δ | Δ | Δ |
| Comparative Example 11 | Δ | Δ | Δ | Δ | Δ |
| Comparative Example 12 | ○ | ○ | ○ | ○ | ○ |
| Comparative Example 13 | ○ | ○ | ○ | ○ | ○ |
| Comparative Example 14 | Δ | Δ | Δ | Δ | Δ |
| Comparative Example 15 | Δ | Δ | Δ | Δ | Δ |
| Comparative Example 16 | ○ | ○ | ○ | ○ | ○ |

As shown in Table 8, it can be seen that the thinner composition of the present invention shows uniform coating regardless of types of photoresists and BARCs, thereby exhibiting improvement in coating property of the photoresist.

Experimental Example 4

Assessment of Rework Performance Depending of Type of Photoresist

Using the thinner compositions in the examples and comparative examples, a rework performance test was executed for 5 types of photoresists and BARCs stated in Table 2. According to the recipes stated in Table 9, after applying 5 types of photoresists to an 8-inch silicon oxide substrate, the wafer obtained after completion of a soft-baking process was subjected to a rework process using each of the thinner compositions. For BARC, the rework process was executed using each of the thinner compositions under such a condition that heat treatment is not conducted after application.

The reworked silicon oxide substrate was subjected to assessment of surface condition using a surface scan equipment (Model: WM-1500) purchased from TOPCON Co. Results of the assessment are shown in Table 10 below.

<Standard for Assessment>

⊚: Less than 1,000 of particles on reworked silicon oxide surface as a result of surface scanning ○: 1,000 or more but less than 2,000 of particles on reworked silicon oxide surface as a result of surface scanning Δ: 2,000 or more but less than 3,000 of particles on reworked silicon oxide surface as a result of surface scanning X: 3,000 or more of particles on reworked silicon oxide surface as a result of surface scanning

TABLE 9

| Step | Time (sec) | Speed (rpm) | Acceleration (rpm/sec) | Dispense (cc) |
|---|---|---|---|---|
| 1 | 2 | 0 | 10000 | 0 |
| 2 | 2 | 1000 | 10000 | 0 |
| 3 | 4 | 1000 | 10000 | 2.0 (Thinner) |
| 4 | 9.5 | 4000 | 10000 | 0 |
| 5 | 0 | 0 | 10000 | 0 |

TABLE 10

| Item | PR1 | PR2 | PR3 | BARC-1 | BARC-2 |
|---|---|---|---|---|---|
| Example 1 | ⊚ | ⊚ | ⊚ | ⊚ | ⊚ |
| Example 2 | ⊚ | ⊚ | ⊚ | ⊚ | ⊚ |
| Example 3 | ⊚ | ⊚ | ⊚ | ⊚ | ⊚ |
| Example 4 | ○ | ○ | ⊚ | ⊚ | ⊚ |
| Example 5 | ⊚ | ⊚ | ⊚ | ⊚ | ⊚ |
| Example 6 | ⊚ | ⊚ | ⊚ | ⊚ | ⊚ |
| Example 7 | ⊚ | ⊚ | ⊚ | ⊚ | ⊚ |
| Comparative Example 1 | ○ | ○ | ○ | ○ | ○ |
| Comparative Example 2 | ○ | ○ | Δ | Δ | X |
| Comparative Example 3 | ○ | ○ | ○ | ○ | ○ |
| Comparative Example 4 | X | X | X | X | X |
| Comparative Example 5 | X | X | X | X | X |
| Comparative Example 6 | ○ | ○ | ○ | ○ | ○ |
| Comparative Example 7 | ○ | ○ | ○ | ○ | ○ |

TABLE 10-continued

| Item | PR1 | PR2 | PR3 | BARC-1 | BARC-2 |
|---|---|---|---|---|---|
| Comparative Example 8 | ○ | ○ | Δ | Δ | Δ |
| Comparative Example 9 | ○ | ○ | Δ | Δ | Δ |
| Comparative Example 10 | ○ | ○ | ○ | ○ | ○ |
| Comparative Example 11 | ○ | ○ | ○ | ○ | ○ |
| Comparative Example 12 | X | X | X | X | X |
| Comparative Example 13 | X | X | X | X | X |
| Comparative Example 14 | X | X | X | X | X |
| Comparative Example 15 | ○ | ○ | ○ | ○ | ○ |
| Comparative Example 16 | ○ | ○ | Δ | Δ | Δ |

As shown in Table 10, it can be seen that the thinner composition of the present invention has excellent rework performance.

What is claimed is:

1. A thinner composition for improving coating property of a resist and for removing the same, comprising:
   10 to 80 percent by weight of alkyl 2-hydroxyisobutyrate, wherein the alkyl has 1 to 5 carbon atoms;
   20 to 90 percent by weight of propyleneglycol alkyl ether acetate, wherein the alkyl has 1 to 5 carbon atoms; and
   a surfactant represented by Formula 1 below in an amount of 10 to 1,000 ppm to a total weight of the alkyl 2-hydroxyisobutyrate and the propyleneglycol alkylether acetate:

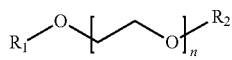

[Formula 1]

wherein $R_1$ and $R_2$ are each independently hydrogen, alkyl group having 1 to 10 carbon atoms or aryl group having 6 to 14 carbon atoms, and n is an integer of 1 to 5.

2. The thinner composition according to claim 1, wherein the alkyl 2-hydroxyisobutyrate is at least one selected from a group consisting of methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate and tert-butyl 2-hydroxyisobutyrate.

3. A method for treatment of a substrate, comprising:
   applying the thinner composition according to claim 2 to a substrate, before application of a photoresist to the substrate.

4. A method for treatment of a substrate, comprising:
   applying the thinner composition according to claim 2 to a substrate, after application of a photoresist to the substrate and before an exposing process.

5. The thinner composition according to claim 1, wherein the propyleneglycol alkylether acetate is at least one selected from a group consisting of propyleneglycol methylether acetate, propyleneglycol ethylether acetate, propyleneglycol propylether acetate, propyleneglycol isopropylethe acetate and propyleneglycol butylether acetate.

6. A method for treatment of a substrate, comprising:
   applying the thinner composition according to claim 5 to a substrate, before application of a photoresist to the substrate.

7. A method for treatment of a substrate, comprising:
   applying the thinner composition according to claim 5 to a substrate, after application of a photoresist to the substrate and before an exposing process.

8. The thinner composition according to claim 1, wherein the surfactant is at least one selected a group consisting of ethyleneglycol methylether, ethyleneglycol dimethylether, ethyleneglycol ethylether, ethyleneglycol methylethylether, ethyleneglycl diethylether, diethyleneglycol methylether, diethyleneglycol dimethylether, diethyleneglycol ethylether, diethyleneglycol methylethylether, diethyleneglycol diethylether, diethyleneglycol propylether, diethyleneglycol methylpropylether, diethyleneglycol ethylpropylether and diethyleneglycol dipropylether.

9. A method for treatment of a substrate, comprising:
   applying the thinner composition according to claim 8 to a substrate, before application of a photoresist to the substrate.

10. A method for treatment of a substrate, comprising:
    applying the thinner composition according to claim 8 to a substrate, after application of a photoresist to the substrate and before an exposing process.

11. The thinner composition according to claim 1, comprising: 20 to 60 percent by weight of the alkyl 2-hydroxyisobutyrate; 40 to 80 percent by weight of the propyleneglycol alkylether acetate; and 10 to 500 ppm of the surfactant to a total weight of the alkyl 2-hydroxyisobutyrate and propyleneglycol alkylether acetate.

12. A method for treatment of a substrate, comprising:
    applying the thinner composition according to claim 11 to a substrate, before application of a photoresist to the substrate.

13. A method for treatment of a substrate, comprising:
    applying the thinner composition according to claim 11 to a substrate, after application of a photoresist to the substrate and before an exposing process.

14. The thinner composition according to claim 1, comprising: 20 to 50 percent by weight of the alkyl 2-hydroxyisobutyrate; 50 to 80 percent by weight of the propyleneglycol alkylether acetate; and 10 to 500 ppm of the surfactant to a total weight of the alkyl 2-hydroxyisobutyrate and propyleneglycol alkylether acetate.

15. A method for treatment of a substrate, comprising:
    applying the thinner composition according to claim 14 to a substrate, before application of a photoresist to the substrate.

16. A method for treatment of a substrate, comprising:
    applying the thinner composition according to claim 14 to a substrate, after application of a photoresist to the substrate and before an exposing process.

17. A method for treatment of a substrate, comprising:
    applying the thinner composition according to claim 1 to a substrate, before application of a photoresist to the substrate.

18. A method for treatment of a substrate, comprising:
    applying the thinner composition according to claim 1 to a substrate, after application of a photoresist to the substrate and before an exposing process.

* * * * *